United States Patent [19]

Hull et al.

[11] 4,367,443
[45] Jan. 4, 1983

[54] RADIO FREQUENCY SIGNAL POWER AMPLIFIER

[75] Inventors: Thomas W. Hull, Hillside; Antonio Pagnamenta, Schaumburg, both of Ill.

[73] Assignee: Motorola, Inc., Schaumburg, Ill.

[21] Appl. No.: 112,771

[22] Filed: Jan. 17, 1980

[51] Int. Cl.³ .......................... H03F 21/00; H03F 1/26
[52] U.S. Cl. ................................ 330/207 P; 330/298; 330/149
[58] Field of Search ................ 455/117, 217; 330/298, 330/207 P, 149, 286, 287

[56] References Cited

U.S. PATENT DOCUMENTS

| | | |
|---|---|---|
| 3,449,680 | 6/1969 | Schilb .................................. 330/298 |
| 3,471,796 | 10/1969 | Wright . |
| 3,652,948 | 3/1972 | Fierstein et al. . |
| 3,671,878 | 6/1972 | Becker ................................. 330/298 |
| 3,714,597 | 1/1973 | Reynolds . |

OTHER PUBLICATIONS

*Motorola Instruction Manual* No. 68P81017E40, "Base and Repeater Stations", 1972.
Motorola Instruction Manual No. 68P81030E10, "Cell Site RF Power Amplifier", 1975.
P. C. Magnusson, "Transmission Lines and Wave Propagation", Chapter 4, Allyn & Bacon, 1965.
*Motorola Instruction Manual* No. 68P81042E10, "Base Site RF Power Amplifier", 1979.

*Primary Examiner*—James B. Mullins
*Assistant Examiner*—Gene Wan

*Attorney, Agent, or Firm*—Rolland R. Hackbart; James W. Gillman

[57] ABSTRACT

A multistage radio frequency (RF) signal power amplifier is described that utilizes microstrip transmission line techniques for realizing essentially all of the matching circuitry for each stage of amplification. The power amplifier includes a variable gain predriver, a driver amplifier and a pair of paralleled final amplifiers, all of which are intercoupled by microstrip coupling circuitry. A power detector senses the magnitude of the final amplifier output and provides a forward power signal having a magnitude proportional thereto. A power output regulator is responsive to the forward power signal for providing a drive signal for varying the gain of the predriver amplifier to maintain the magnitude of the final amplifier output at a preset magnitude. The RF signal power amplifier further includes spurious signal suppression circuitry coupled to the output of the driver amplifier and final amplifiers for suppressing spurious signals generated by regenerative modes of oscillation occurring therein. The spurious signal suppression circuitry includes a resistor coupled to a microstrip transmission line having a length such that the line is a relatively low impedance at the spurious signal frequencies and a high impedance at the RF signal frequency. Thus, the spurious signals are attenuated by the resistor, while the RF signal is essentially unaffected. The RF signal power amplifier embodying the present invention may be advantageously utilized in a radio communication system for amplifying signals to be transmitted by a base station radio.

16 Claims, 7 Drawing Figures

RADIO FREQUENCY SIGNAL POWER AMPLIFIER

RELATED APPLICATIONS

The instant application is related to co-pending application, Ser. No. 112,765, invented by Antonio Pagnamenta, entitled "Impedance Matching Circuitry for Radio Frequency Signal Power Amplifiers", and assigned to the same assignee and filed the same date as the instant application.

BACKGROUND OF THE INVENTION

The present invention relates generally to signal amplifiers, and more particularly to radio frequency (RF) signal power amplifiers for use in radio communication systems.

Prior art RF signal power amplifiers, such as those amplifiers described in U.S. Pat. Nos. 3,471,796, 3,652,948 and 3,714,597, typically have been constructed by utilizing discrete circuit elements, which must be carefully arranged on conventional printed circuit boards in order to assure operability. However, such RF signal power amplifiers are difficult to manufacture because of the need for fine tuning adjustments which are accomplished by adding hand-selected trimming components. The discrete circuitry type of RF signal power amplifiers have been utilized for amplifying RF signals having frequencies in the 20 MHz to 200 MHz range.

At higher operating frequencies, for example, frequencies in the 400–500 MHz range, RF signal power amplifiers may practically utilize microstrip transmission line techniques, since the wavelength of RF signals at these frequencies and corresponding lengths of the microstrip transmission line circuitry are relatively short. RF signal power amplifiers utilizing microstrip transmission line circuitry are described in U.S. Pat. No. 3,671,878 and in *Motorola Instruction Manual No. 68P81017E40*, entitled "Base and Repeater Stations", published by Motorola Service Publications Department, Motorola, Inc., Schaumburg, Ill., 1972. The use of microstrip transmission line techniques in RF signal power amplifiers becomes even more attractive as the frequency of the RF signal increases. For example, in the 800–900 MHz frequency range, microstrip transmission line techniques have been utilized in an RF signal power amplifier described in *Motorola Instruction Manual No. 68P81030E10*, entitled "Cell Site RF Power Amplifier", published by Motorola Service Publications, Motorola, Inc., Schaumburg, Ill., 1975. However, none of the foregoing prior art RF signal power amplifiers utilizing either discrete circuitry techniques or microstrip transmission line techniques provide a high degree of spurious signal rejection, while at the same time, providing for simple and inexpensive manufacturability by minimizing the number of hand assembly operations.

SUMMARY OF THE INVENTION

Accordingly, it is a general object of the present invention to provide an improved RF signal power amplifier that may be inexpensively manufactured by utilizing microstrip transmission line techniques to greatly reduce the number of hand assembly operations.

It is another object of the present invention to provide an improved RF signal power amplifier that provides an amplified RF signal having a high degree of spurious signal rejection.

It is yet another object of the present invention to provide an improved RF signal power amplifier that provides an amplified RF signal having an accurately regulated magnitude which is continuously adapted according to ambient temperatures, while also being stepwise reduced when potentially destructive amplifier operating temperatures are reached.

In practicing the present invention, circuitry for amplifying an RF signal having a predetermined frequency includes a first amplifier having input and output microstrip coupling circuitry, a second amplifier having input and output microstrip coupling circuitry, a third amplifier having input and output microstrip coupling circuitry, spurious signal suppression circuitry having a series coupled resistive component and a microstrip transmission line, forward power sensing circuitry for sensing the magnitude of the amplified RF signal provided by the amplifying circuitry, and regulating circuitry for adjusting the amplification of the first amplifier to maintain the magnitude of the amplified RF signal provided by the amplifying circuitry at a predetermined magnitude. The first, second and third amplifiers are coupled together in a forward path for amplifying the RF signal. The first, second and third amplifiers may each include a power transistor device, which is impedance matched by the input and output microstrip coupling circuitry of the respective amplifiers to a predetermined impedance. For example, each of the amplifiers may be intercoupled by microstrip transmission lines having a characteristic impedance of 50 ohms. Thus, the impedance matching for each of the amplifiers is provided essentially entirely by its respective input and output microstrip coupling circuitry. Furthermore, resistive components included in the circuitry for each of the amplifiers may be plated on suitable substrates together with the input and output microstrip coupling circuitry, leaving only interstage coupling capacitors, voltage supply decoupling capacitors and voltage supply feed inductors that need be discrete components.

The spurious signal suppression circuitry includes a resistive component coupled to a microstrip transmission line for suppressing spurious signals in preselected frequency bands. For example, the microstrip transmission line in the spurious suppression circuitry may have a length substantially equal to one-half wavelength of the RF signal for attenuating spurious signals having frequencies in a predetermined range centered about one-half of the predetermined RF signal frequency. Thus, for spurious signals in this frequency range, the microstrip transmission line presents a low impedance termination, thereby subjecting the spurious signals to the attenuation of the resistive components. However, at the predetermined RF signal frequency, the microstrip transmission line presents a high impedance, thereby subjecting the RF signal to negligible attenuation. Thus, the length of the microstrip transmission line may be selected in accordance with the frequency of the spurious signals to be suppressed. Moreover, additional spurious signal suppression circuitry may also be provided between the second and third amplifiers for suppressing spurious signals occurring there.

The amplifying circuitry of the present invention may be advantageously utilized in a base station of a mobile radio communication system for amplifying RF signals to be transmitted by the base station to mobile radio stations.

BRIEF DESCRIPTION OF THE DRAWINGS

FIGS. 3A and 3B, when arranged together, are a plan view of the microstrip transmission line circuitry and electrical circuit components in the final amplifiers 120 and 122 in FIG. 1.

DETAILED DESCRIPTION OF THE PREFERRED EMBODIMENT

Figure 1:
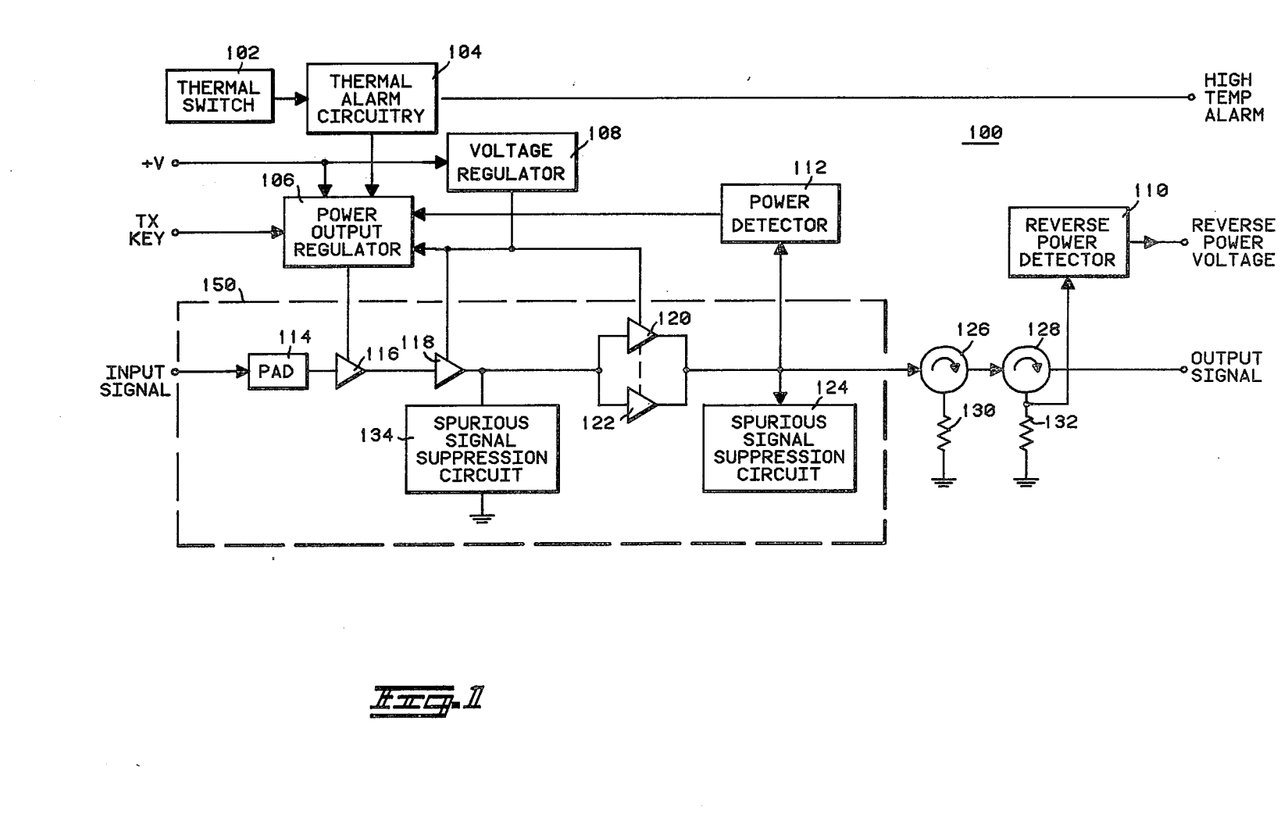
FIG. 1 is a general block diagram of an RF signal power amplifier embodying the present invention.

In FIG. 1, there is illustrated an RF signal power amplifier 100 embodying the present invention. The amplifier 100 is adapted to receive an RF signal at its input and provide at its output the RF signal amplified by three stages of amplification in amplifying circuitry 150. For example, the amplifier 100 may be utilized in the 800 to 900 MHz frequency range for amplifying a nominal one watt input signal to provide a 45 watt output signal, where the voltage +V is 25 volts. The amplifier 100 further includes thermal sensing circuitry 102 and 104 for reducing the amplification by a predetermined amount when the temperature of the amplifier in the amplifying circuit 150 becomes excessively high. The thermal protection circuitry 102 and 104 also provides a high temperature alarm indication signal when detecting the excessively high temperatures.

Figure 5:
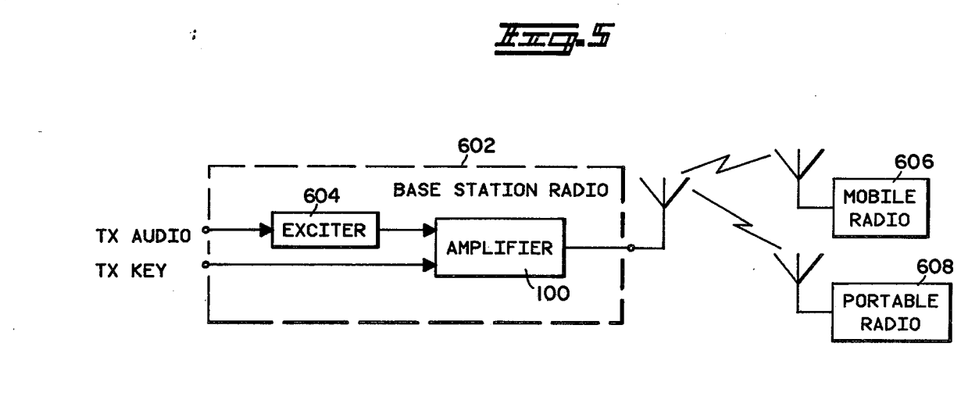
FIG. 5 is a block diagram of a radio communication system which may advantageously utilize the RF signal power amplifier in FIG. 1.
Figure 7A:
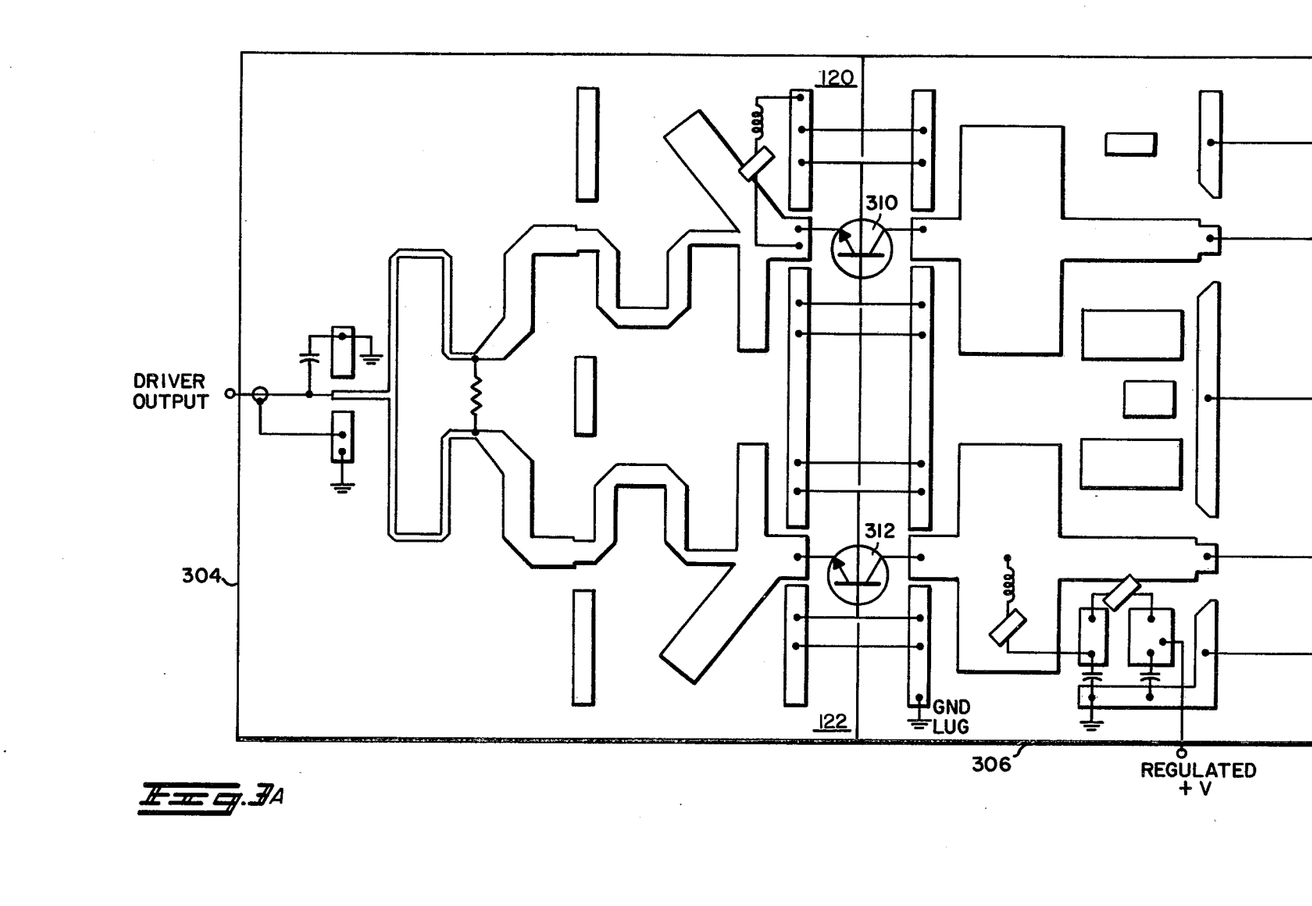
Figure 7B:
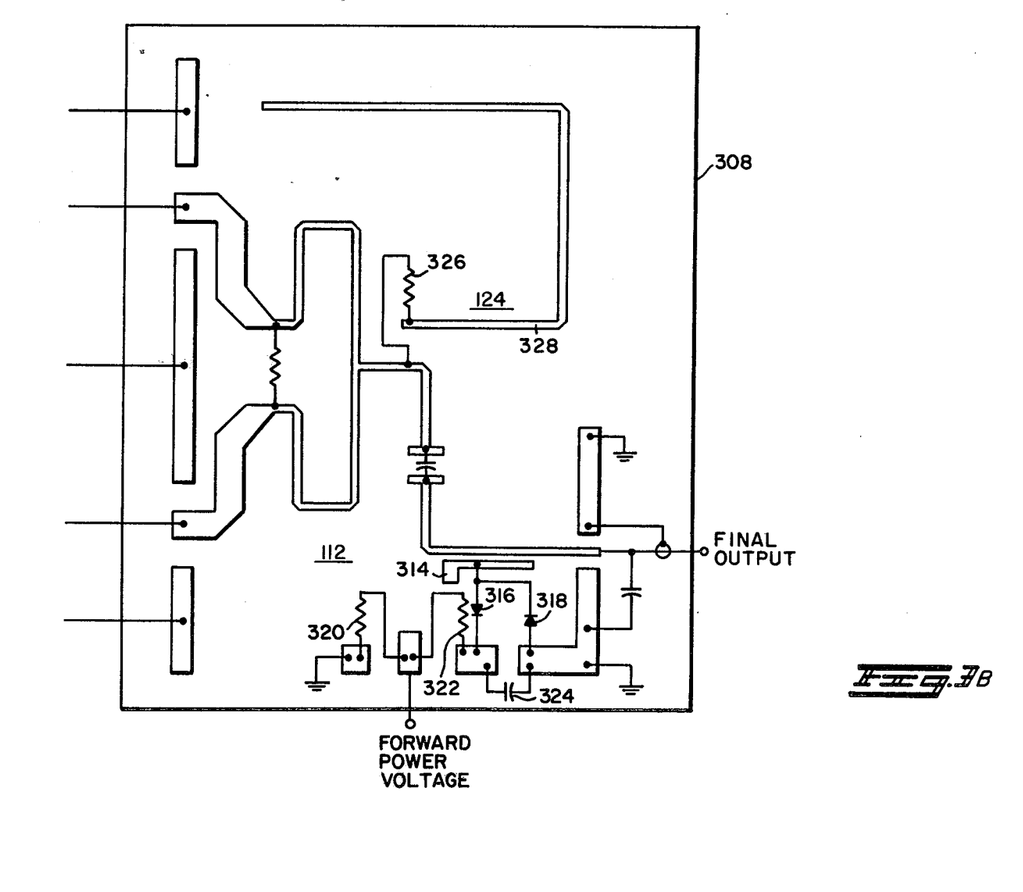

The RF signal power amplifier 100 of the present invention is particularly well adapted for use in mobile radio communication systems, such as that illustrated in FIG. 5. The amplifier 100 may be utilized in a base station radio 602 in FIG. 5 for amplifying RF signals modulated by transmitter (TX) audio signals in exciter 604. The amplified signals provided by amplifier 100 are coupled to the base station antenna for transmission to mobile radios 606 and portable radios 608 in the mobile radio communication system. Since the amplifier 100 may be enabled and disabled by the transmitter (TX) key signal, amplifier 100 may be utilized in mobile radio communication systems where it is desired to enable the amplifier only during the transmission of the transmitter audio signals. For example, amplifier 100 may be advantageously utilized in the base station radio of the mobile radio-telephone communication system described in U.S. Pat. No. 3,906,166.

Referring to FIG. 1, the amplifying circuitry 150 consists of three stages of amplification, a Class B predriver amplifier 116, a Class C driver amplifier 118 and Class C final amplifiers 120 and 122. The amplifiers are interconnected by microstrip coupling circuitry that may be provided on alumina substrates. The details of the microstrip coupling circuitry are provided hereinbelow with reference to FIGS. 2 and 3. The RF signal to be amplified, such as an RF signal from the exciter 604 of FIG. 5, is first coupled to a 50 ohm T pad attenuator 114 which attenuates the RF signal by approximately 5 dB. The power level of input RF signal may vary between 0.75 to 1.6 watts in the preferred embodiment of the present invention.

The signal from T pad attenuator 114 is coupled via microstrip coupling circuitry to predriver amplifier 116, which operates as a Class B amplifier, amplifying the RF signal in proportion to a voltage control signal provided by power output regulator 106. Thus, the gain of the predriver amplifier 116 is varied in accordance with the voltage control signal from the power output regulator 106 for maintaining the magnitude of the amplified output signal from the final amplifiers 120 and 122 at a preset magnitude. To provide a 45 watt output signal from power amplifier 100, the predriver amplifier 116 amplifies a nominal one watt input signal to provide a 2.5 watt output signal.

The amplified RF signal from predriver amplifier 116 is coupled by microstrip coupling circuitry to driver amplifier 118 which operates as a Class C amplifier. The driver amplifier 118 amplifies the nominal 2.5 watt signal from the predriver amplifier 116 to provide a 14 watt output signal.

Next, the amplified RF signal from driver amplifier 118 is symmetrically coupled by microstrip coupling circuitry to final amplifiers 120 and 122. The microstrip coupling network provides in phase and equal portions of the amplified signal from driver amplifier 118 to each of the final amplifiers 120 and 122. Final amplifiers 120 and 122 also operate as Class C amplifiers, whose outputs are symmetrically recombined by microstrip coupling circuitry before application to circulator 126. The final amplifiers 120 and 122 amplify a nominal 13 watt signal from driver amplifier 118 to provide a 58 watt signal, which, when coupled through circulators 126 and 128, results in a 45 watt output signal.

The amplified RF signal from final amplifiers 120 and 122 is then coupled by circulators 126 and 128 to the output of power amplifier 100, which may in turn be coupled to a base station antenna, as illustrated in FIG. 5. Circulators 126 and 128 are conventional three port ferromagnetic devices that are constructed such that signals entering in one port will be unidirectionally coupled to the next port only. Thus, the amplified signal from amplifiers 120 and 122 is coupled by circulator 126 unidirectionally to circulator 128, and by circulator 128 unidirectionally to its output port and thereafter to a base station antenna. In addition, interferring signals, received by a base station antenna, may be coupled unidirectionally from the output port of circulator 128 to resistor 132 by circulator 128. Attenuated interferring signals reaching the output of circulator 126 are likewise coupled unidirectionally to resistor 130. Thus, the interferring signals, which could produce intermodulation product signals if reaching final amplifiers 120 and 122, are diverted to resistors 130 and 132. Signals will also be coupled to resistors 130 and 132 if there is a mismatch between the output of circulator 128 and the antenna. Such a mismatch causes a portion of the amplified RF signal to be reflected back to circulator 128, appearing at resistor 132. The reflected RF signal appearing at resistor 132 is coupled to reverse power detector 110, which utilizes conventional circuitry to develop a reverse power voltage that is proportional to the magnitude of the reflected RF signal at resistor 132. The reverse power voltage developed by the reverse power detector 110 is useful for determining when circulator 128 is properly terminated to an antenna.

The amplified RF signal from final amplifiers 120 and 122 is also coupled to power detector 112 which provides a forward power signal having a magnitude that is proportional to the the magnitude of the amplified RF signal. The forward power signal from power detector 112 is then coupled to power output regulator 106, which adjusts the voltage control signal to predriver amplifier 116 for maintaining the amplified RF signal from final amplifiers 120 and 122 at a preset magnitude, as will be explained hereinbelow with reference to FIG. 4.

The amplified RF signals from driver amplifier 118 and from final amplifiers 120 and 122 are also coupled to spurious signal suppression circuitry 134 and 124, respectively. As is known in the art, high gain RF power amplifiers inherently tend to regeneratively oscillate at various subfrequencies of the RF signal frequency. These regenerative oscillations produce spurious signals which will be transmitted together with the amplified RF signal unless such spurious signals are suppressed. If transmitted, these spurious signals will not degrade the performance of radios tuned to the predetermined RF signal frequency, but may cause interference in other radios tuned to the frequencies of the spurious signals. Thus, the spurious signal suppression circuitry 134 and 124 are provided for suppressing the regenerative modes of oscillation in the driver amplifier 118 and final amplifiers 120 and 122, respectively. According to an important feature of the present invention, the spurious signal suppression circuitry 134 and 124 essentially consist of a resistive component series coupled with a microstrip transmission line of a predetermined length. The length of the microstrip transmission line is selected such that a low impedance is presented at the frequency of the spurious signals and a high impedance is presented at the predetermined RF signal frequency. The spurious signals are thereby greatly attenuated by the resistive component which is terminated by the low impedance presented by the microstrip transmission line, while, at the same time, the amplified RF signal is essentially unaffected.

The supply voltage for the amplifiers 116, 118, 120 and 122 is developed from a supply voltage, +V, by a voltage regulator 108, which may be a conventional series-pass regulator. Thus, voltage regulator 108 allows the +V supply voltage to vary over a predetermined range, such as 25 to 30 volts, while maintaining a constant output voltage, such as +25 volts, to all of the amplifiers.

Amplifier 100 also includes thermal switch 102 and thermal alarm circuitry 104 for providing a high temperature alarm if the temperature of the amplifiers 116, 118, 120 and 122 exceeds a predetermined temperature, such as, for example, 75° C. Thermal switch 102 is mounted near amplifiers 116, 118, 120 and 122, for example, on a heatsink (not shown) to which the amplifiers are thermally coupled, for sensing the temperature of the amplifiers and indicating when the sensed temperature exceeds a predetermined temperature. When this occurs, the thermal switch 102 provides an output signal to alarm circuitry 104. Alarm circuitry 104 includes a buffer device (see FIG. 4) coupled to the output from thermal switch 102 for providing a high temperature alarm signal. Alarm circuitry 104 also couples the output from thermal switch 102 to power output regulator 106. Power output regulator 106 is responsive to the output the thermal switch 102 for reducing the magnitude of the amplified RF signal by a predetermined amount, for example, by approximately 3 dB. Thus, according to an important feature of the present invention, by reducing the magnitude of the amplified RF signal provided by power amplifier 100, additional heat rise and the potential destruction of the amplifiers 116, 118, 120 and 122 may be avoided.

Figure 2A:
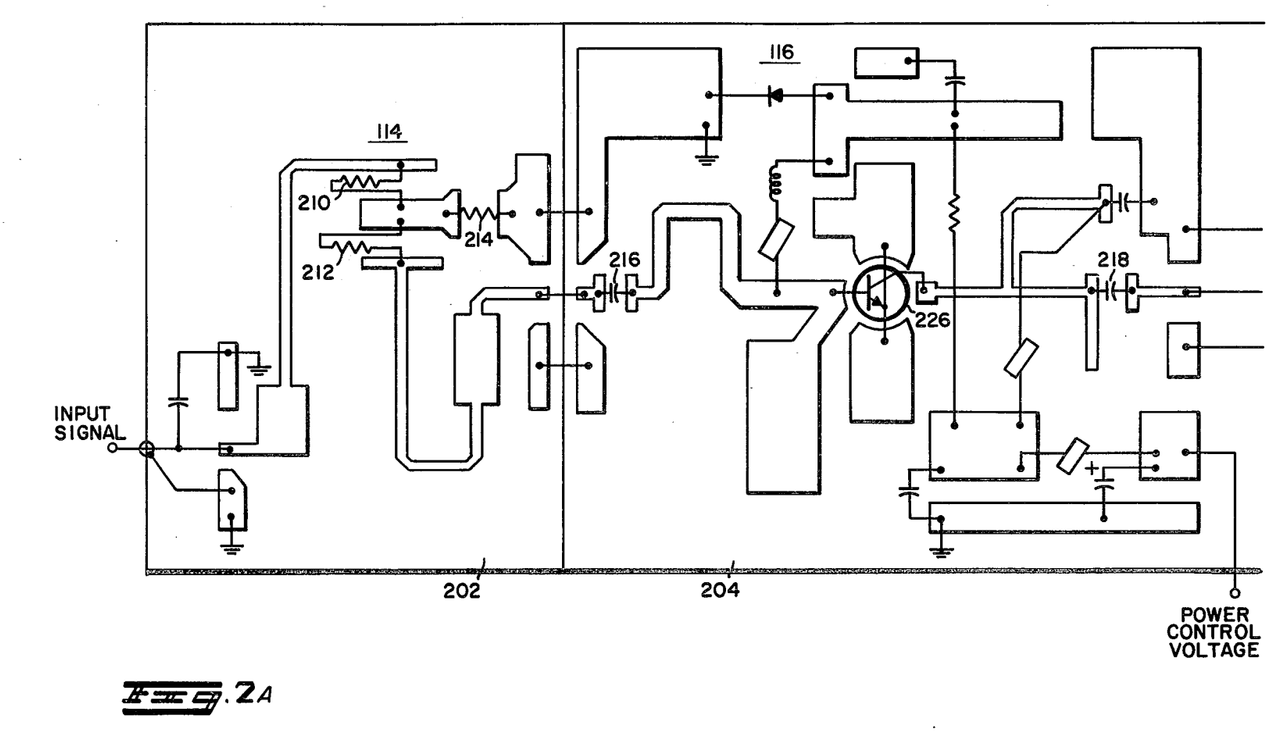
FIGS. 2A and 2B, when arranged together, are a plan view of the microstrip transmission line circuitry and electrical circuit components in the predriver amplifier 116 and driver amplifier 118 in FIG. 1.
Figure 2B:
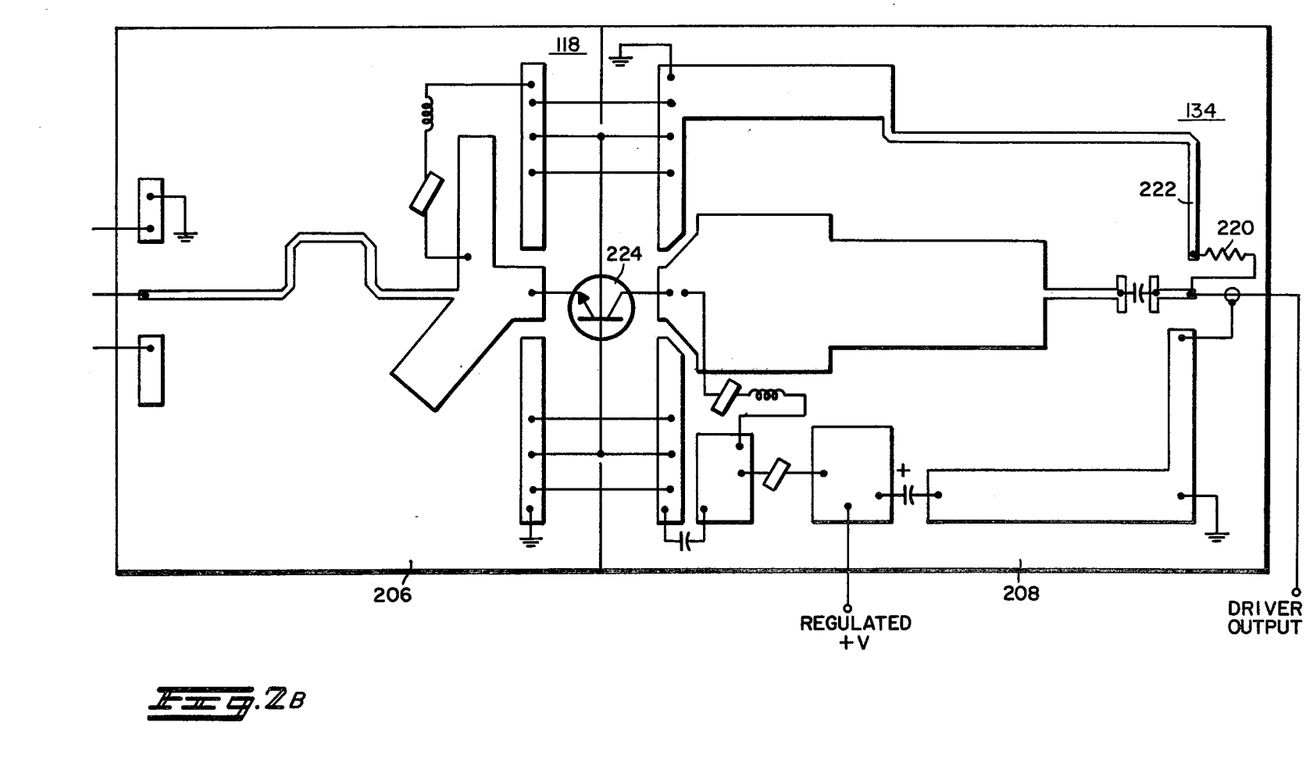

In accordance with another feature of the present invention, the circuitry intercoupling the amplifiers 116, 118, 120 and 122 is provided by microstrip transmission lines disposed on alumina substrates, as illustrated in FIGS. 2 and 3. The microstrip transmission lines are plated on the top surface of the alumina substrates, and a ground plane is plated on the bottom surface of the alumina substrates. By utilizing microstrip coupling circuitry, the amplifying circuitry 150 may be easily and inexpensively manufactured. The microstrip coupling circuitry between the respective amplifiers is provided on separate alumina substrates and mounted together with the amplifiers on a one-piece aluminum heatsink (not shown). After mounting the amplifying circuitry 150 on the aluminum heatsink, assembly is completed by merely soldering the amplifiers and substrates together.

Referring to FIGS. 2A and 2B, there is illustrated the predriver amplifier 116 and driver amplifier 118 in FIG. 1 together with their corresponding microstrip coupling circuitry. The microstrip coupling circuitry in FIGS. 2A and 2B are provided on four alumina substrates 202, 204, 206 and 208 which may be strapped together when mounted to a suitable heatsink. Substrate 202 includes the T pad attenuator 114 of FIG. 1, substrate 204 includes the microstrip coupling circuitry and power transistor 226 for predriver amplifier 116, FIG. 1 and substrates 206 and 208 include the microstrip coupling circuitry and power transistor 224 for driver amplifier 118 of FIG. 1. Resistive components 210, 212, 214 and 220 may be provided by resistors plated directly onto the respective substrates. Capacitive components 216 and 218 may be provided by conventional chip capacitors which are readily soldered to the microstrip circuitry on the substrate.

In accordance with the present invention, the spurious signal suppression circuitry 134 in FIG. 1 is provided by plated resistor 220 and microstrip transmission line 222 in FIG. 2B. In the preferred embodiment, resistor 220 is a 50 ohm resistor, while microstrip transmission line 222 has a length of one-fourth wavelength of the predetermined RF signal frequency and is further connected to signal ground. Thus, resistor 220 is terminated by a relatively low impedance to signal ground for spurious signals having frequencies less than one-fourth of the predetermined RF signal frequency, and is terminated by a relatively high impedance for RF signals at the predetermined RF signal frequency. According to transmission line theory (for example, see Chapter 4 of the text, "Transmission Lines and Wave Propogation," written by Philip C. Magnusson and published by Allyn and Bacon, Inc., 1965), if microstrip transmission line 222 is grounded, the line 222 presents a low impedance to ground to signals for which the length of line 222 is equal to multiples of one-half wavelength or less than one-sixteenth wavelength, and presents a high impedance to ground to signals for which the length of line 222 is equal to odd multiples of one-fourth wavelength. For example, if the desired RF signal frequency is 880 MHz, the length of the microstrip transmission line 222 may be selected to be one-fourth wavelength at 880 MHz for suppressing spurious signals having frequencies less than 220 MHz.

Referring to FIGS. 3A and 3B, there is illustrated the microstrip coupling circuitry for final amplifiers 120 and 122 and power detector 112 of FIG. 1. The microstrip coupling circuitry of FIGS. 3A and 3B includes three substrates 304, 306 and 308. The output from the driver amplifier 118 on substrate 208 of FIG. 2B may be coupled by a 50 ohm coaxial cable to substrate 304 in FIG. 3A. On substrate 304, the output from the driver amplifier is then divided into two equal, cophased portions, which are applied to the emitters of power transistors 310 and 312. The amplified outputs from power transistors 310 and 312 are coupled via the microstrip coupling circuitry on substrate 306 to substrate 308 where they are symmetrically combined to provide the final amplifier output. The final amplifier output is thereafter coupled to circulators 126 and 128 in FIG. 1.

Substrate 308 in FIG. 3B also includes spurious signal suppression circuitry 326 and 328 (124 in FIG. 1) similar to that on substrate 208 in FIG. 2B. Here, the microstrip transmission line 328 has a length of one-half wavelength of the predetermined RF signal frequency and is not connected to signal ground. Thus, if the desired RF signal frequency is 880 MHz, resistor 326 (also 50 ohms) is terminated by a low impedance for attenuating spurious signals having frequencies centered about 440 MHz, and is terminated by a high impedance for passing RF signals having frequencies centered about 880 MHz. Since microstrip transmission line 328 is terminated by an open circuit, the line 328 presents a short circuit to signals for which the length of line 328 is equal to odd multiples of one-fourth wavelength, and presents an open circuit to signals for which the length of line 222 is equal to multiples of one-half wavelength. Thus, according to the present invention, the length of the microstrip transmission line 328 in the spurious signal suppression circuitry in FIG. 3B may be selected so that the spurious signals are greatly attenuated, while the RF signal is essentially unaffected.

Substrate 308 in FIG. 3B further includes circuitry for the forward power detector 112 for providing the forward power signal to regulator 106 in FIG. 1. The forward power detecting circuitry on substrate 308 includes microstrip transmission line 314 for sampling the final amplifier output, diode 314 and 318 for rectifying the sampled signal to provide a DC voltage across capacitor 324, and resistors 320 and 322 for dividing the voltage across capacitor 324 to provide the forward power signal. The magnitude of the forward power signal developed by the forward power detecting circuitry on substrate 308 is proportional to the square root of the amplified signal from the final amplifiers. The power output regulator 106 in FIG. 1 is responsive to the forward power signal from the forward power detector 112 for maintaining the magnitude of the final amplifier output at a preset magnitude.

Figure 4:
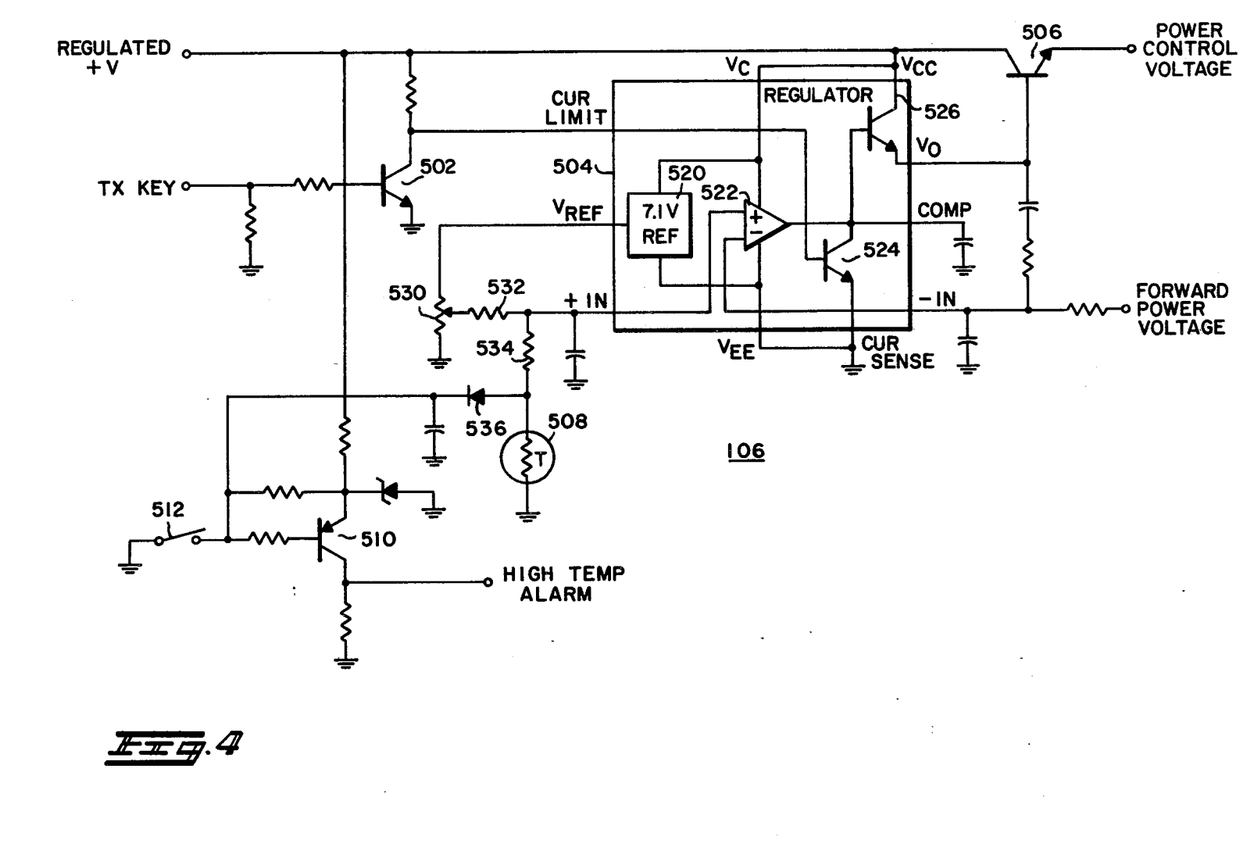
FIG. 4 is a detailed circuit diagram of the electrical circuit components in the power output regulator 106 in FIG. 1.

Referring to FIG. 4, there is illustrated the detailed circuitry of the power output regulator 106 in FIG. 1. The power output regulator essentially consists of a single integrated circuit device, which, in the preferred embodiment, is a Motorola type MC1723 voltage regulator. The voltage regulator 504 is coupled to the regulated +V voltage provided by voltage regulator 108 in FIG. 1. The voltage regulator 504 includes a 7.1 volt reference voltage circuit 520, a comparator 522, a current limit transistor 524, and an output drive transistor 526. The forward power signal from the forward power detector 112 in FIG. 1 is coupled to comparator 522 for comparison with a voltage developed from the 7.1 volt reference voltage by way of potentiometer 530. By varying the voltage provided by potentiometer 530, the magnitude of the final amplifier output can be adjusted to provide any suitable desired magnitude. Once potentiometer 530 has been set, comparator 522 adjusts the drive current to transistor 526, which in turn controls the drive current to transistor 506. The drive current from transistor 526 is converted by transistor 506 into a voltage control signal for controlling the amplification of predriver amplifier 116 in FIG. 1.

According to yet another feature of the present invention, the power amplifier may be switchably enabled and disabled in response to the transmitter (TX) key signal. The TX key signal is applied via transistor 502 to the current limit transistor 524 of regulator 504. To enable the power amplifier, the TX key signal applies a positive voltage to transistor 502, which applies a ground to the base of current limit transistor 524 causing it to turn off. When current limit transistor 524 is off, comparator 522 is enabled to control transistor 526. Conversely, when a ground is applied by the TX key signal to transistor 502, transistor 502 turns off, and current limit transistor 524 turns on and applies a ground to the output of comparator 522 for disabling the power amplifier. Thus, not only does regulator 504 accurately control the magnitude of the amplified RF signal from the final amplifiers, but also provides for switchably enabling and disabling the power amplifier.

According to a further feature of the present invention, the power output regulator 106 includes thermal protection circuitry 102 and 104 in FIG. 1 for protecting the power amplifier circuitry from potentially destructive high temperatures. In FIG. 5 the thermal protection circuitry includes thermistor 508 and thermal alarm switch 512, which are coupled via resistor divider 532 and 534 to the reference voltage provided by potentiometer 530. The thermal alarm switch 512 senses the temperature of the amplifiers, and if the sensed temperature exceeds approximately 75° C., the thermal alarm switch 512 closes to provide a ground to resistor divider 532 and 534 via diode 536. Thus, when the thermal alarm switch 512 applies a ground to resistor divider 532 and 534, the reference voltage provided by potentiometer 530 is reduced for correspondingly reducing the magnitude of the final amplifier output by a predetermined amount, such as 3 dB. Also, when the thermal alarm switch 512 closes, transistor 510 is enabled to provide a +5 volt output at its collector, the high temperature alarm signal. The high temperature alarm signal may then be utilized to light an alarm indicator or to enable circuitry which will disable the power amplifier if the alarm indication is still present after a predetermined time interval.

Thermistor 508 is also coupled to resistor divider 532 and 534 for varying the reference voltage provided by potentiometer 530 as the ambient temperature varies. For example, as the ambient temperature rises, the resistance of thermistor 508 decreases for correspondingly reducing the reference voltage provided by potentiometer 530. Thus, thermistor 508 continuously varies the reference voltage provided by potentiometer 530 for varying the magnitude of the final amplifier output substantially in inverse proportion to the variation of the ambient temperature. Furthermore, the thermal protection circuitry of the power output regulator 106 protects the transistors of the amplifiers 116, 118, 120 and 122 from destruction by excessive heat dissipation by reducing the magnitude of the final amplifier output as the temperature increases.

The RF signal power amplifier illustrated in FIGS. 1–4 is described in further detail in *Motorola Instruction Manual* No. 68P81042E10, entitled "Base Site RF Power Amplifier", published by Motorola Service Publications, Motorola, Inc., Schaumburg, Illinois, 1979.

In summary, a novel, multi-stage RF signal power amplifier has been described that utilizes microstrip transmission line techniques for realizing essentially all of the matching circuitry and spurious signal suppression circuitry for each stage of amplification. The RF signal power amplifier further includes an accurately controlled power output regulator that is responsive to both ambient temperatures and amplifier device temperatures for appropriately adapting the magnitude of the amplified RF signal provided by the power amplifier. Accordingly, the RF signal power amplifier embodying the present invention is not only inexpensive and modular in construction, but also provides an amplified RF signal having an accurately regulated magnitude and relatively low levels of spurious signal interference.

We claim:

1. Circuitry for amplifying a radio frequency (RF) signal having a predetermined frequency and being provided by a signal source, comprising:
   first amplifying means including input and output microstrip coupling circuitry, said first amplifying means being coupled to the RF signal by its input microstrip coupling circuitry for amplifying the RF signal substantially in proportion to the magnitude of a drive signal, the amplified RF signal being coupled from the first amplifying means by its output microstrip coupling circuitry;
   second amplifying means including input and output microstrip coupling circuitry, said second amplifying means being coupled by its input microstrip coupling circuitry to the amplified RF signal from the first amplifying means for further amplifying the RF signal, the further amplified RF signal being coupled from the second amplifying means by its output microstrip coupling circuitry;
   spurious signal suppression means including resistor means series coupled to microstrip transmission line means, said spurious signal suppression means being coupled to the amplified RF signal from the second amplifying means for suppressing the generation of spurious signals having frequencies in a predetermined range of frequencies centered about one-half of the predetermined RF signal frequency, the microstrip transmission line means of the spurious signal suppression means having a length substantially equal to one-half wavelength of the RF signal;
   forward power sensing means coupled to the amplified RF signal from the second amplifying means for providing a forward power signal having a magnitude that is substantially proportional to the magnitude of the amplified RF signal from the second amplifying means; and
   regulating means for providing the drive signal to the first amplifying means, said regulating means being responsive to the magnitude of the forward power signal from the forward power sensing means for regulating the magnitude of the drive signal to the first amplifying means to maintain the magnitude of the amplifier signal from the second amplifying means at a predetermined magnitude.

2. The amplifying circuitry according to claim 1, further including second spurious signal suppression means including resistor means series coupled to microstrip transmission line means, said second spurious signal suppression means coupled to the amplified RF signal from the first amplifying means for suppressing the generation of spurious signals having to frequencies less than one-fourth of the predetermined RF signal frequency, said microstrip transmission line means of the second spurious signal suppression means having a length substantially equal to the one-fourth wavelength of the RF signal.

3. The amplifying circuitry according to claim 1, further including thermal switch means responsive to the temperature of said second amplifying means for providing an indication signal when the temperature of said second amplifying means reaches a predetermined temperature, said regulating means responsive to the indication signal for decreasing the magnitude of the amplified RF signal from the second amplifying means by a predetermined amount.

4. The amplifying circuitry according to claim 1, wherein the input and output microstrip coupling circuitry are each provided on separate substrates each having first and second surfaces for receiving plated circuitry thereon, the first surface of each substrate receiving the respective microstrip coupling circuitry and the second surface of each substrate being plated with a conductive substance for providing a ground plane.

5. The amplifying circuitry according to claim 4, wherein the substrates are comprised of alumina.

6. The amplifying circuitry according to claim 4, wherein the resistor means of the first and second spurious signal suppression means are comprised of resistors screened onto the respective substrates.

7. The amplifying circuitry according to claim 1, wherein said first spurious signal suppression means includes capacitor means, for capacitively coupling the resistor means of the first spurious signal suppression means to the amplified RF signal from the second amplifying means, and the microstrip transmission line means of the first spurious signal suppression means further being coupled to signal ground.

8. The amplifying circuitry according to claim 1, wherein said second amplifying means includes first and second transistor means symmetrically coupled to the amplified RF signal from the first amplifying means by the input microstrip coupling circuitry of the second amplifying means, and the further amplified RF signal from the first and second transistor means being combined and symmetrically coupled therefrom by the output microstrip coupling circuitry of the second amplifying means.

9. The amplifying circuitry according to claim 1 or 8, further including circulator means having an input and an output, the input of said circulator means being coupled to the amplified RF signal from the second amplifying means for unidirectionally coupling the amplified RF signal from the input to the output of the circulator means, said circulator means substantially preventing signals from passing from its output to its input.

10. The amplifying circuitry according to claim 1, wherein said regulating means includes:
   means for providing a key signal for enabling said amplifying circuitry;
   voltage reference means for providing a reference voltage signal having a predetermined magnitude;

means coupled to the reference voltage from the voltage reference means for providing a control voltage signal having a magnitude that is substantially determined by a pre-established ratio of the predetermined magnitude of the reference voltage signal;

means for comparing the control voltage signal to the forward power signal and providing an error voltage signal proportional to the difference between the control voltage signal and the forward power signal;

output transistor means coupled to the error voltage signal for providing the drive signal when enabled; and switching transistor means coupled to the output transistor means, said switching transistor means responsive to the presence of the key signal for enabling the output transistor means and responsive to the absence of the key signal for disabling the output transistor means.

11. The amplifying circuitry according to claim 10, wherein said voltage comparing means further includes:

thermistor means responsive to the ambient temperature for varying the control voltage signal substantially in inverse proportion to the ambient temperature; and thermal switch means responsive to the temperature of the second driving means for decreasing the magnitude of control voltage signal to a magnitude substantially determined by a pre-established ratio of the magnitude of the control voltage signal.

12. The amplifying circuitry according to claims 9 or 11, adapted to amplify an RF signal for transmission by a base station of a radio communication system.

13. The amplifying circuitry according to claim 2 wherein said second spurious signal suppression means includes capacitor means, said capacitor means for capacitively coupling the resistor means of the second spurious signal suppression means to the amplified RF signal from the first amplifying means, and the microstrip transmission line means of the second spurious signal suppression means further being coupled to signal ground.

14. The amplifying circuitry according to claim 1, further including third amplifying means interposed between the first and second amplifying means, said third amplifying means including input and output microstrip coupling circuitry, and being coupled by its input microstrip coupling circuitry to the amplified RF signal from the first amplifying means for further amplifying the RF signal therefrom, the further amplified RF signal being coupled from the third amplifying means by its output microstrip coupling circuitry.

15. The amplifying circuitry according to claim 14, further including second spurious signal suppression means including resistor means series coupled to microstrip transmission line means, said second spurious signal suppression means being coupled to the amplified RF signal from the third amplifying means for suppressing the generation of spurious signals having frequencies less than one-fourth of the predetermined RF signal frequency, said microstrip transmission line means of the second spurious signal suppression means having a length substantially equal to the one-fourth wavelength of the RF signal.

16. The amplifying circuitry according to claim 15 wherein said second spurious signal suppression means includes capacitor means, said capacitor means for capacitively coupling the resistor means of the second spurious signal suppression means to the amplified RF signal from the third amplifying means, and the microstrip transmission line means of the second spurious signal suppression means further being coupled to signal ground.

* * * * *